United States Patent [19]

Ohashi

[11] Patent Number: 5,512,872
[45] Date of Patent: Apr. 30, 1996

[54] PERMANENT MAGNET ARRANGEMENT FOR USE IN MAGNETRON PLASMA PROCESSING

[75] Inventor: Ken Ohashi, Fukui, Japan

[73] Assignee: Shin-Etsu Chemical Co., Ltd., Tokyo, Japan

[21] Appl. No.: 179,551

[22] Filed: Jan. 10, 1994

[30] Foreign Application Priority Data

Jan. 8, 1993 [JP] Japan .................................. 5-017979

[51] Int. Cl.$^6$ .................................................. H03F 7/02
[52] U.S. Cl. ............................................................ 335/306
[58] Field of Search .................................... 335/284, 302, 335/306; 310/152–156, 90.5; 204/298.16–298.22; 210/222

[56] References Cited

U.S. PATENT DOCUMENTS

| | | | |
|---|---|---|---|
| 3,781,592 | 12/1973 | Harrold | 335/210 |
| 4,227,105 | 10/1980 | Kumakura | 310/153 |
| 4,283,647 | 8/1981 | Herr et al. | 310/154 |
| 4,605,198 | 8/1986 | Kulish | 210/222 |
| 4,622,122 | 11/1986 | Landau . | |
| 4,717,876 | 1/1988 | Masi et al. | 324/303 |
| 5,170,085 | 12/1992 | Shinto | 310/156 |

OTHER PUBLICATIONS

Patent Abstracts of Japan No. 63277758.
Patent Abstracts of Japan No. 57188679.

*Primary Examiner*—Leo P. Picard
*Assistant Examiner*—Raymond M. Barrera
*Attorney, Agent, or Firm*—Lowe, Price, LeBlanc & Becker

[57] ABSTRACT

A permanent magnet arrangement for magnetron plasma processing is disclosed. The arrangement includes a plurality of permanent magnets each of which has a fan-shaped or equilateral cross section parallel to the major surfaces thereof. The permanent magnets are assembled to form the permanent magnet arrangement which takes a disk-like configuration or a polygon. Each of the plural permanent magnets is made of rare-earth material and radially or essentially radially magnetized.

14 Claims, 7 Drawing Sheets

PERMANENT MAGNET ARRANGEMENT FOR USE IN MAGNETRON PLASMA PROCESSING

BACKGROUND OF THE INVENTION

1. Field of the Invention

The present invention relates generally to a permanent magnet arrangement for magnetron plasma processing and more specifically to such an arrangement for magnetically confining plasma in order to implement magnetron ion sputtering. The present invention is also applicable to magnetron ion etching as well.

2. Description of the Prior Art

It is known in the art to use enhanced magnetron plasma for fabricating electronic devices by sputtering or etching, wherein a magnetically confined plasma is effectively utilized to attain high ion densities and low ion energies.

Before turning to the present invention it is deemed advantageous to briefly discuss a magnetron sputtering apparatus with reference to FIGS. 1–6.

FIG. 1 is a diagram schematically showing a magnetron sputtering apparatus which is enclosed in a chamber case or housing although not shown. FIG. 2 is a plan view of a magnetic field generator of the apparatus 8.

In FIG. 1, the magnetron sputtering apparatus, depicted by numeral 8, includes an anode 10 and a cathode 12 which are arranged parallel with each other. The anode 10 is grounded and carries a substrate 14 on which sputtered material is deposited. On the other hand, the cathode 12 is coupled to an RF (radio frequency) power source 15 and carries thereon a target 16 which is a solid piece of the material to be deposited. Further, a magnetic field generator 18 is attached to the bottom of the cathode 12.

As best seen in FIG. 2, the magnetic field generator 18 includes a yoke 20 on which an annular permanent magnet 22 and a cylindrical permanent magnet 24 are concentrically provided. These magnets 22 and 24 are magnetically arranged in the illustrated manner. In FIG. 1, magnetic field lines denoted by numeral 26 are generated between the magnets 22 and 24, while a solid arrow 28 represents the direction of electric field.

When electric discharge is established between the electrodes 10 and 12 in an environment containing Argon gas (for example), a plasma (viz., a highly ionized gas) is generated. As is well known in the art, electrons move under the combined force of an electric field and a magnetic field along cycloid curves and further enhance ionization. The drift applied to the electrons results from the magnetic field which is parallel to the surface of the target (viz., the magnetic field perpendicular to the electric field). Therefore, in order to effectively drift the electrons for the purposes of further ionizing plasmas, it is vital to uniformly generate the components of the magnetic field which are parallel to the surface of the target 16.

Merely for the convenience of description, the components of the magnetic field parallel to the surface of the target 16 may sometimes be referred to as parallel or horizontal magnetic field.

FIG. 3 is a diagram schematically showing the manner wherein an electron 32 is drifted along a cycloid curve 34 under the combined force of an electric and magnetic fields as mentioned above. This physical phenomena is well known in the art and hence further discussion thereof will be deemed redundant.

The permanent magnet arrangement shown in FIGS. 1 and 2, however, has encountered the drawback in that the magnitude of the horizontal magnetic field varies across the surface of the target 16. Thus, a highly ionized plasma is unable to be generated over a wide area of the target 16. This means that the target 16 is sputtered at only the portions where the horizontal magnetic field is exhibited. That is, the target is partially consumed or sputtered. This partial consumption of the surface of the target leads to the fact that the life of the target 16 is undesirably shortened and thus decreases the efficiency of utility thereof.

In order to overcome the above mentioned drawbacks, several permanent magnet arrangements have been proposed.

FIG. 4 shows one of the known approaches to overcoming the aforesaid drawbacks. As shown, there are provided a central cylindrical magnet 36 and two annual magnets 38 and 40, all of which are concentrically arranged on a yoke 42 having the same diameter as the outer magnet 40. This arrangement, however, has suffered from the problem that the magnetic field is perpendicular to the surface of the yoke 42 at the center and peripheral portions and thus, the components of the magnetic field, which are parallel to the surface of a target to be provided adjacent to the arrangement of FIG. 4, are not expected over a wide area of the surface of the target.

FIG. 5 shows another known permanent magnet arrangement which includes a semi-cylindrical magnet 50 which is surrounded by a D-shaped magnet 52. These magnets 50 and 52 are placed on a yoke 54 with the poles arranged in the illustrated manner. On the other hand, FIG. 6 illustrates still another conventional permanent magnet arrangement which includes an eccentrically provided magnet 56 which is surrounded by two irregularly shaped closed magnets 58 and 60. These magnets 56, 58 and 60 are provided on a yoke 62 in the illustrated manner.

With the arrangements shown in FIGS. 5 and 6, in order to generate horizontal magnetic field on the corresponding target, each of the yokes 54 and 62 should be rotated around the axis thereof. Thus, the prior art techniques shown in FIGS. 5 and 6 have suffered from the following drawbacks:

(a) a magnetron sputtering apparatus is inevitably rendered complex in that appropriate rotation mechanism is required to revolve the yokes 54 or 62 around the axis thereof;

(b) the interior of the apparatus is apt to become contaminated by fine particles produced from the rotating mechanism; and (c) the manufacturing of the magnet arrangement on the corresponding yoke is relatively expensive due to the complex configuration.

It is therefore highly desirable to overcome the aforesaid prior art difficulties with a simple arrangement of permanent magnets.

The foregoing has been made with the magnetron sputtering where the magnetic field generator 18 is placed adjacent to the target 16. In contrast, the magnetic field generator 18 is located in the vicinity of the substrate 14 in the case of magnetron etching. The instant invention is applicable to both the magnetron sputtering and etching as well.

SUMMARY OF THE INVENTION

It is an object of the present invention to provide a permanent magnet arrangement by which magnetic field in parallel with the surface of a target (in the case of sputtering) or a substrate (in the case of etching) can be obtained in a wider region over the target or substrate.

In brief, the above object is achieved by a permanent magnet arrangement for magnetron plasma processing is disclosed. The arrangement includes a plurality of permanent magnets each of which has a fan-shaped or equilateral cross section parallel to the major surfaces thereof. The permanent magnets are assembled to form the permanent magnet arrangement which takes a disk-like configuration or a polygon. Each of the plural permanent magnets is made of rare-earth material and radially or essentially radially magnetized.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 7:
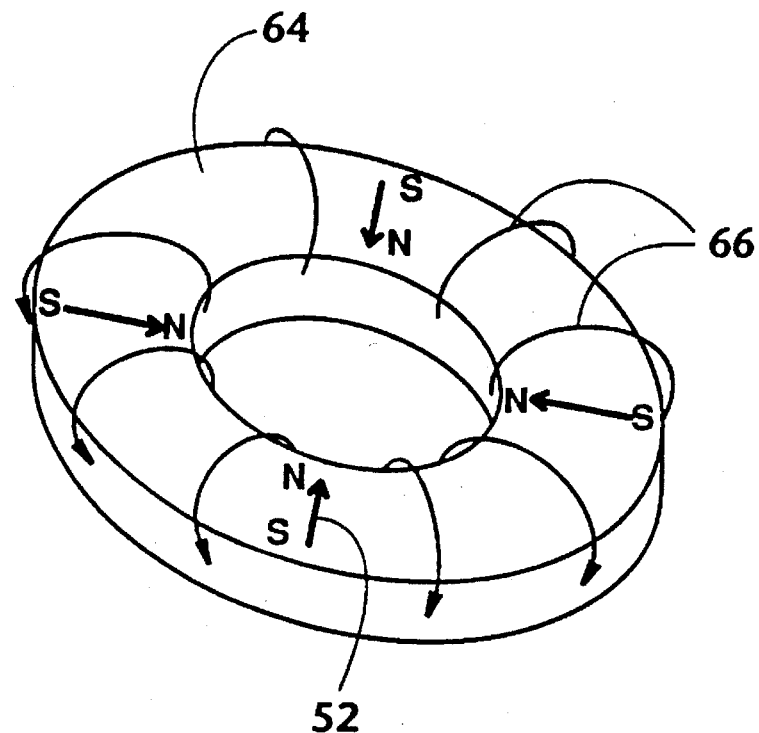
FIG. 7 is a perspective schematic view of a ring-shaped permanent magnet which was considered when the present invention was made.

The inventor studied in detail the magnetic field produced by a ring-shaped permanent magnet 64 (FIG. 7) which is magnetized radially inwardly (viz., toward the center thereof) as shown by numeral 52. Opposite magnetic poles of this magnet 64 appear on the inner and outermost annular edges, respectively. Therefore, the magnetic field lines 66 of the ring-shaped magnet, which originate at the inner pole, terminate at the opposite (viz., outer) pole in the illustrated manner. The inventor observed that the smaller the diameter of the aperture the wider the area over which the magnetic field parallel to the surface of the magnet 64 exist. That is, if no aperture is formed (viz., in the case of a disk shaped magnet), the horizontal components of the magnetic field can be obtained over the widest area over the magnet. Further, if a disk shaped magnet of rare-earth material (such as Nd-Fe-B or 2-17 type of Sm-Co magnet) is used in the above mentioned magnetron sputtering apparatus, it is possible to obtain horizontal components of magnetic field which are highly suitable to magnetron sputtering.

Figure 8:
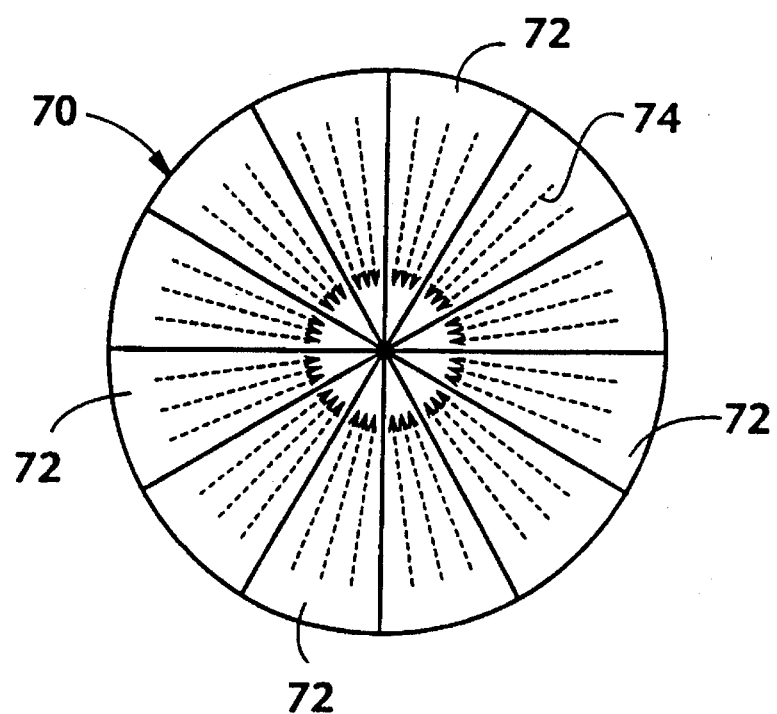
FIG. 8 is a plan view of the first embodiment of the present invention.

Reference is now made to FIG. 8, wherein a first embodiment of the present invention is schematically shown in a plan view.

Figure 1:
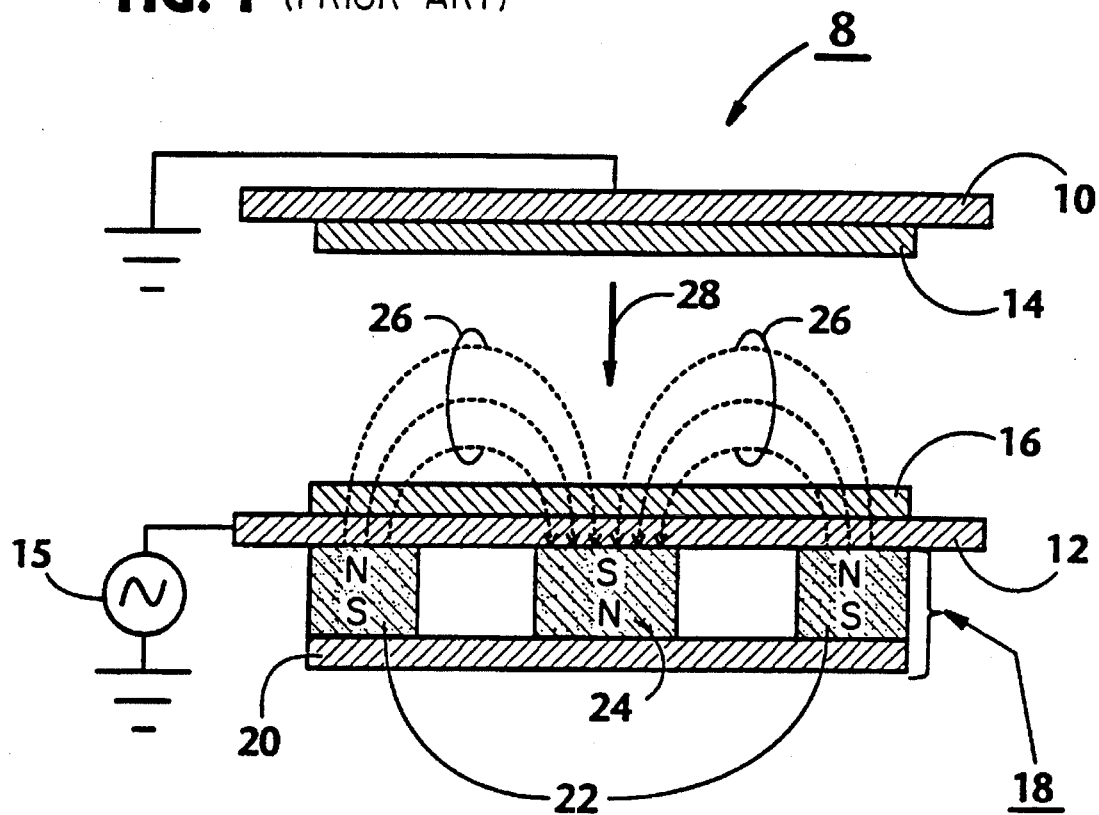
FIG. 1 is a diagram schematically showing the conventional magnetron sputtering apparatus to which the instant invention is applicable, referred to in the opening paragraphs of the instant disclosure.
Figure 2:
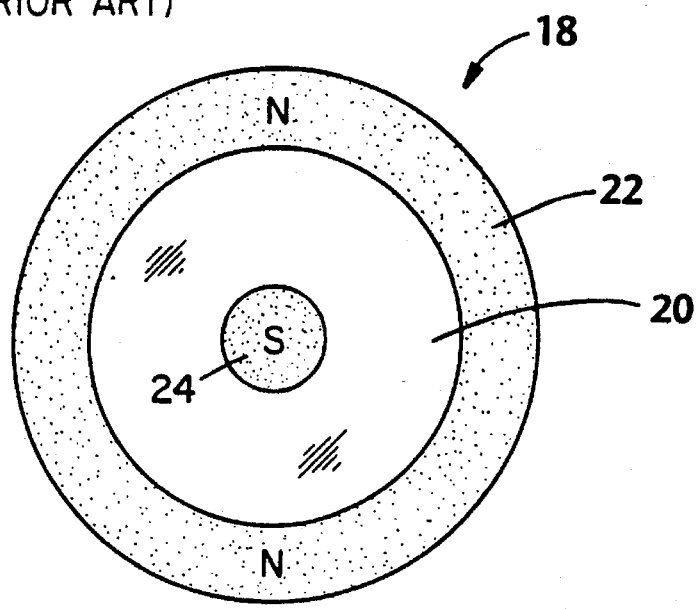
FIG. 2 is a plan view of a magnetic field generator used in the device shown in FIG. 1.
Figure 3:
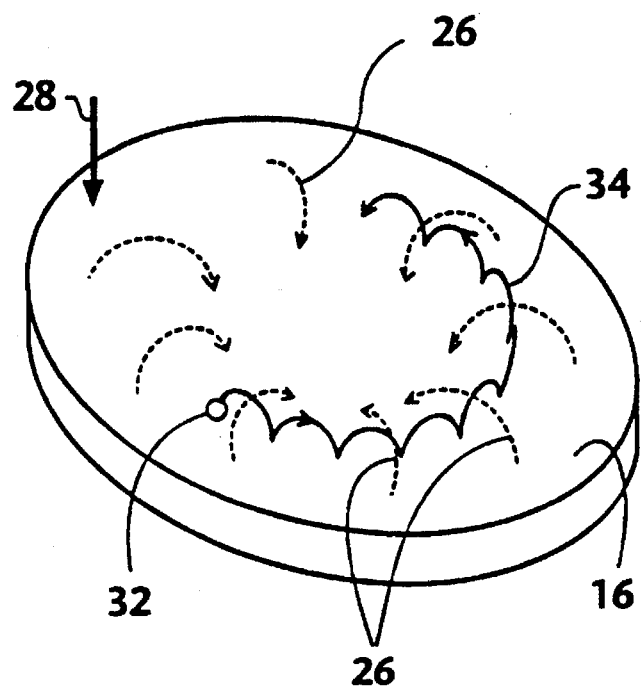
FIG. 3 is a sketch showing the cycloid electron movement induced by the combined force of an electric field and a magnetic field discussed in the opening paragraphs of the instant disclosure.
Figure 4:
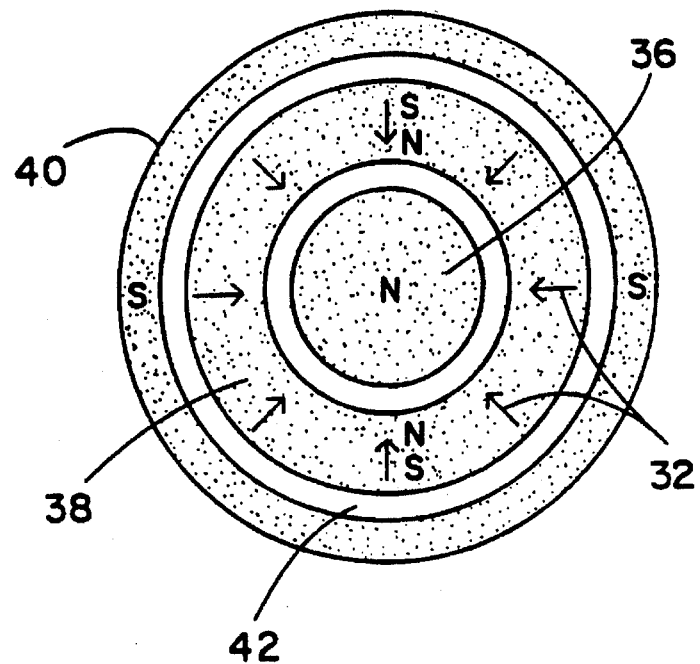
FIG. 4 is a plan view of the second conventional magnetic field generator discussed in the opening paragraphs of the instant disclosure.
Figure 5:
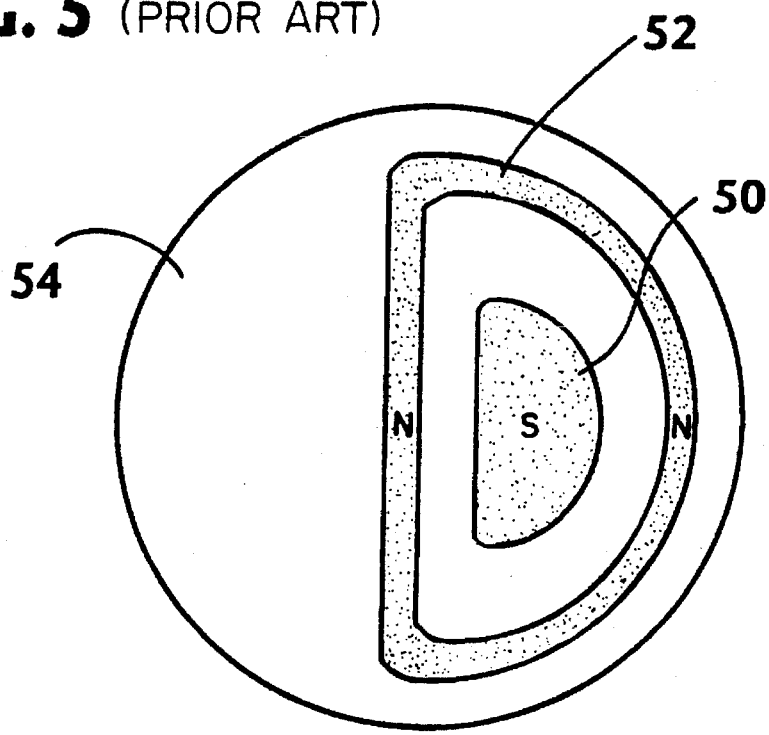
FIG. 5 is a plan view of the third conventional magnetic field generator also discussed in the opening paragraphs of the instant disclosure.
Figure 6:
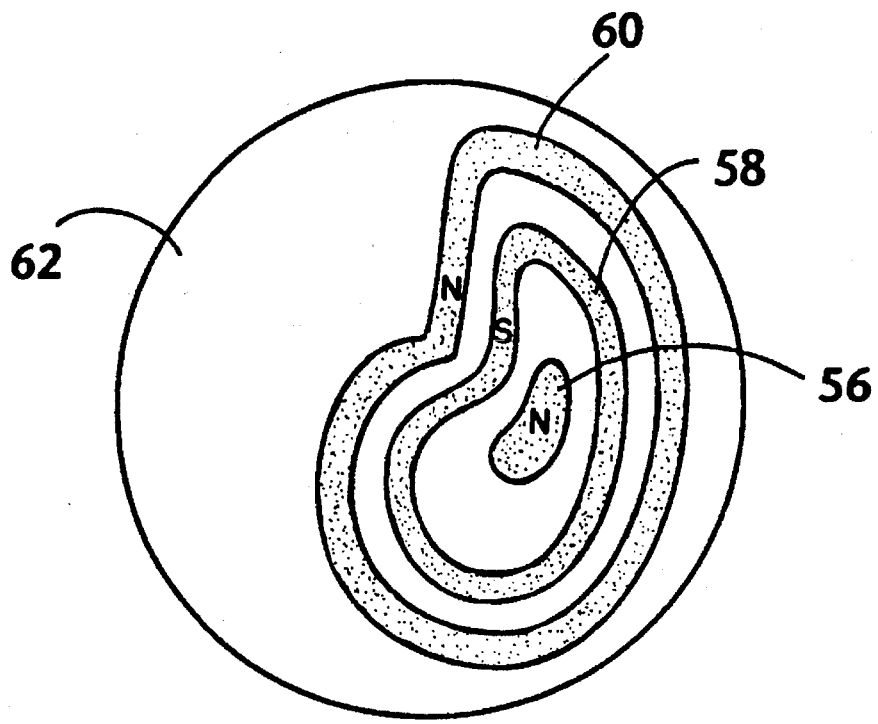
FIG. 6 is a plan view of the fourth conventional magnetic field generator discussed in the opening paragraphs of the instant disclosure.

A permanent magnet arrangement shown in FIG. 8, depicted by numeral 70, is provided with a plurality of magnet 72 the number of which is twelve (12) in this particular case. As shown, each magnet 72 has a fan-shaped cross section parallel to the major surfaces thereof. The magnets 72 are combined or assembled to a disk-shaped configuration using a suitable adhesive or the like. When the magnet arrangement 70 is applied to a magnetron plasma processing device, a yoke is attached to one major surface of the magnet assembly as in the case shown in FIG. 1. The yoke is prepared such as to have the same diameter as the magnet arrangement 70 in the instant embodiment. Each of the fan-shaped magnets 72 is radially magnetized as illustrated by broken line arrows 74. The number of the magnets 72 may be determined considering ease of magnetization and thus is not limited to the number shown in FIG. 8. This holds for the other embodiments of the present invention set forth below.

Figure 9:
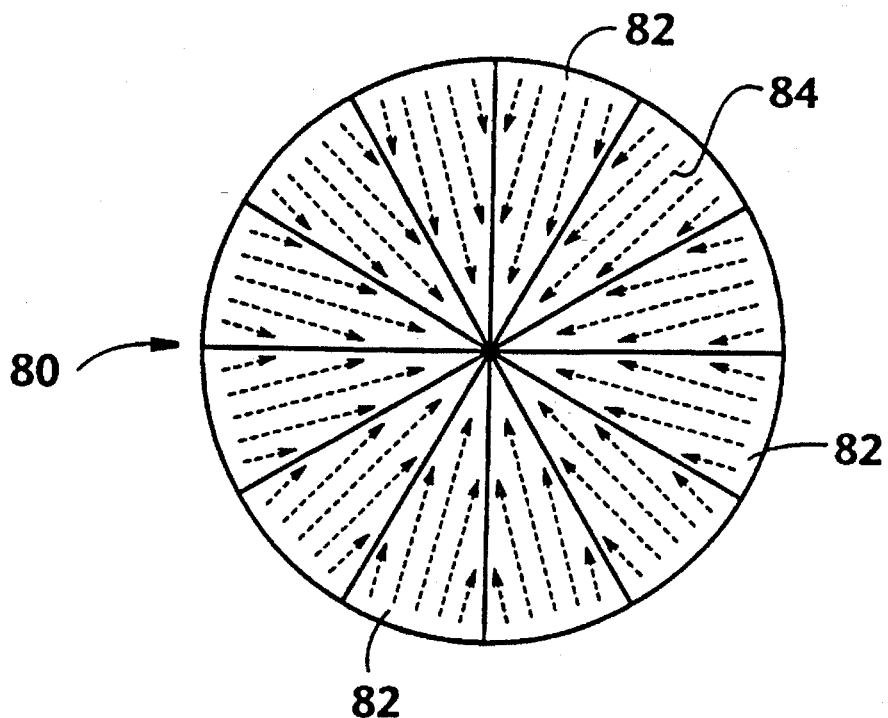
FIG. 9 is a plan view of the second embodiment of the present invention.

FIG. 9 is a diagram schematically showing the second embodiment of the present invention. The permanent magnet arrangement of FIG. 9, depicted by numeral 80, differs from that of FIG. 8 in that the former arrangement 80 includes a plurality of magnets 82 each of which is magnetized in a manner different from the counterpart of FIG. 8 as illustrated by broken line arrows 84. That is, each magnet 82 is magnetized in the direction parallel to the line originating from the midpoint of a circular arc to the convex of the magnet. Other than this, the permanent magnet arrangement if FIG. 9 is essentially identical to that of FIG. 8.

Figure 10:
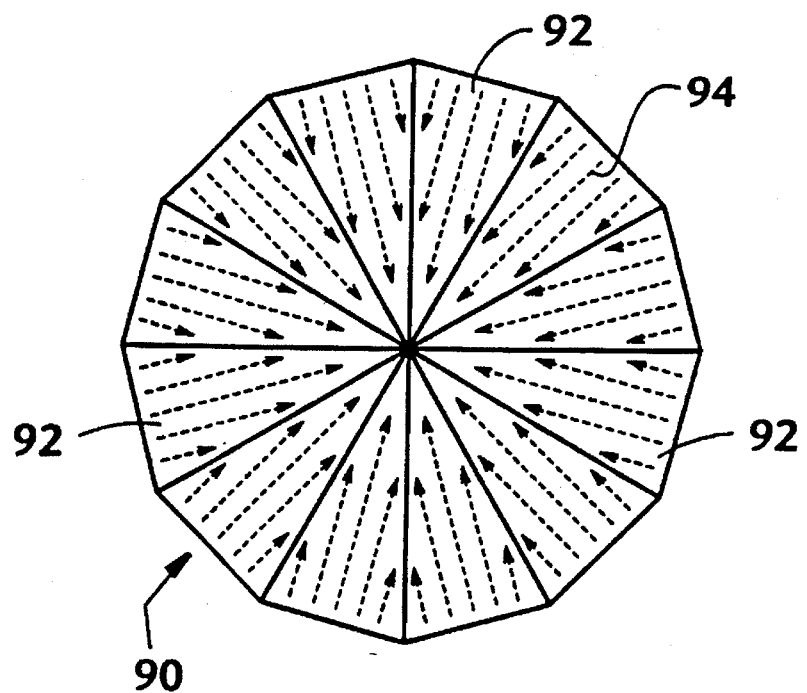
FIG. 10 is a plan view of the third embodiment of the present invention.

FIG. 10 is a diagram schematically showing the third embodiment of the present invention. The permanent magnet arrangement of FIG. 10, depicted by numeral 90, differs from that of FIG. 9 in that the former arrangement 90 includes a plurality of magnets 94 each of which has an equilateral triangle cross section parallel to the major surfaces thereof. The manner of magnetization of the third embodiment is essentially the same as that of the second embodiment. That is, each magnet 92 is magnetized in the direction parallel to the center line originating from the midpoint of the base of the magnet (or the triangle) to the convex thereof. Other than this, the permanent magnet arrangement of FIG. 10 is essentially identical to that of FIG. 9.

Figure 11:
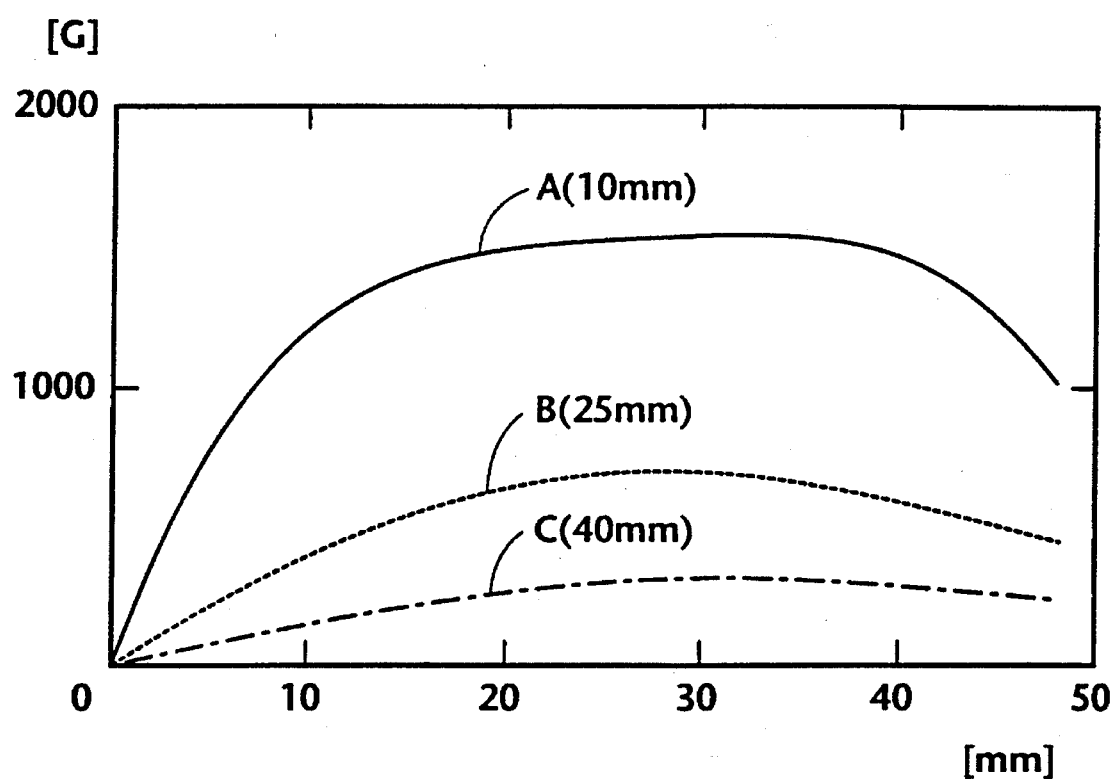
FIG. 11 is a sketch showing magnetic field strength vs. the distance in a radial direction from the center of a permanent magnet arrangement of a type shown in FIG. 9 wherein the parameter is the distance above the surface of the arrangement.

FIG. 11 is a sketch which shows magnetic field strength as a function of the distance in a radical direction from the center of a permanent magnet arrangement of the type shown in FIG. 9. In the graph of FIG. 11, the parameter is the distance over the surface of the arrangement 80. Each of the magnets 82 of the arrangement 80 used in the experiment conducted by the inventor was a permanent magnet of Nd-Fe-B. The magnet arrangement or assembly 80 had a diameter of 100 mm and a thickness of 20 mm. Curves A, B and C was plotted when the distance over the surface of the arrangement 80 was 10 mm, 25 mm, and 40 mm, respectively. As illustrated, the curve A indicates the most desirable characteristics which shows magnetic flat ranging a relatively long distance with large field strength.

Figure 12:
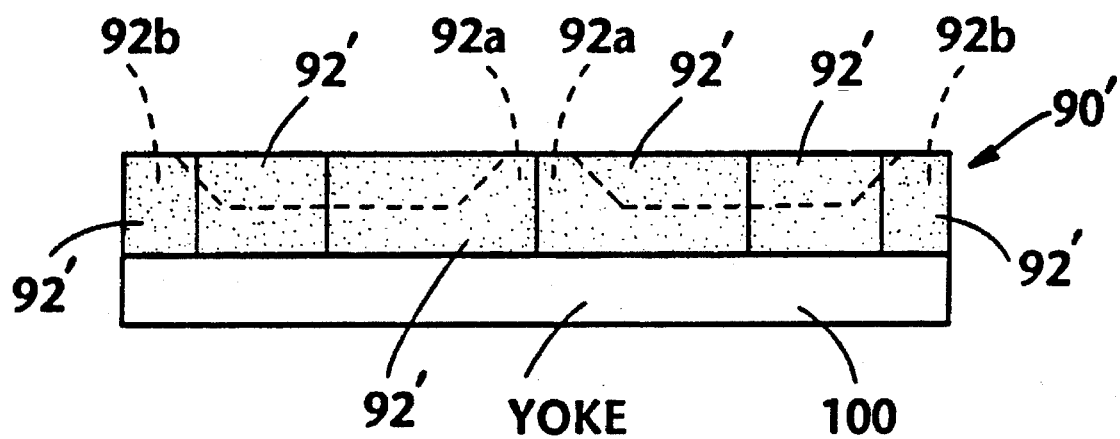
FIG. 12 is a side elevation of a variant of the third embodiment shown in FIG. 10.
Figure 13:
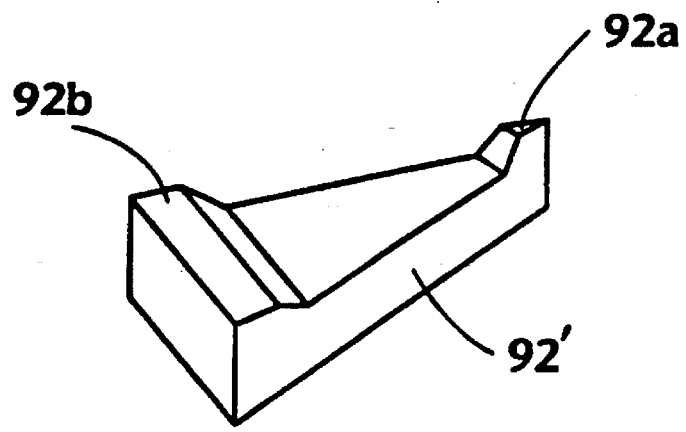
FIG. 13 is a perspective schematic view of one of the magnets used in the variant shown in FIG. 12.

FIG. 12 is a diagram schematically showing a variant of the third embodiment shown in FIG. 10, while FIG. 13 is a perspective view of one of the magnets used in the arrangement shown in FIG. 12. The portions and elements shown in FIGS. 12 and 13, which correspond to the counterparts of FIG. 10, are denoted by like numerals plus a prime for the sake of simplifying the descriptions.

As in the case of the third embodiment, a permanent magnet arrangement 90' is provided on a yoke (denoted by numeral 100) and includes twelve (12) magnets 92'. As shown, each magnet 92' has two portions 92a and 92b each of which is formed such as to have a thickness larger than a remaining portion thereof. The portion 92b is adjacent to a vertex of the magnet 92', while the other portion 92a is adjacent to a circular arc of the magnet. This variant is suitable for enhancing the magnetic field strength at the center and peripheral portions of the arrangement 90'. Further, the variant is characterized in that the magnetic field's components, which are parallel with the surface of the arrangement 90', increase at the center and peripheral portions of the arrangement 90'. It goes without saying that either of the portions 92a and 92b can be omitted considering or depending on practical applications.

It should be noted that this variant can be applied to the first and second embodiments.

In order to further improve the flatness of the magnetic field's components parallel to the surface of either of the arrangements shown in FIGS. 8–10 and 12–13, the radius of the magnet arrangement is determined such as to be greater than that of a target under which the magnet arrangement is provided. It is empirically preferable that a ratio of the radius of the magnet arrangement to that of the target is more than 1.1.

It will be understood that the above disclosure is representative of only three possible embodiments of the present invention and the variant thereof and that the concept on which the invention is based is not specifically limited thereto.

What is claimed is:

1. A permanent magnet arrangement for magnetron plasma processing, comprising:

a plurality of permanent magnets each of which has a sector-shaped cross section parallel to major surfaces thereof, said sector-shaped cross section including a single vertex, said plurality of permanent magnets being assembled to form said permanent magnet arrangement which has a disk-like configuration, each of said plurality of permanent magnets being made of a rare-earth material and radially magnetized.

2. A permanent magnet arrangement as claimed in claim 1, wherein each of said plurality of permanent magnets has a portion, adjacent to a vertex, which is formed such as to have a thickness larger than a remaining portion thereof.

3. A permanent magnet arrangement as claimed in claim 1, wherein each of said plurality of permanent magnets has a portion, adjacent to a circular arc thereof, which is formed such as to have a thickness larger than a remaining portion thereof.

4. A permanent magnet arrangement as claimed in claim 1, wherein each of said plurality of permanent magnets has first and second portions each of which is formed such as to have a thickness larger than a remaining portion thereof, said first portion being adjacent to a vertex of the permanent magnet, and said second portion being adjacent to a circular arc of the permanent magnet.

5. A permanent magnet arrangement as claimed in claim 1, wherein a ratio of the radius of said permanent magnet arrangement to a radius of a target provided in the vicinity of said permanent magnet arrangement is more than 1.1.

6. A permanent magnet arrangement for magnetron plasma processing, comprising:

a plurality of permanent magnets each of which has a sector-shaped cross section parallel to major surfaces thereof, said sector-shaped cross section including a single vertex, said plurality of permanent magnets being assembled to form said permanent magnet arrangement which has a disc-like configuration, each of said plurality of permanent magnets being made of a rare-earth material and magnetized in a direction parallel to a line originating from a midpoint of a circular arc to a vertex of said permanent magnet.

7. A permanent magnet arrangement as claimed in claim 6, wherein each of said plurality of permanent magnets has a portion, adjacent to a vertex, which is formed such as to have a thickness larger than a remaining portion thereof.

8. A permanent magnet arrangement as claimed in claim 6, wherein each of said plurality of permanent magnets has a portion, adjacent to a circular arc thereof, which is formed such as to have a thickness larger than a remaining portion thereof.

9. A permanent magnet arrangement as claimed in claim 6, wherein each of said plurality of permanent magnets has first and second portions each of which is formed such as to have a thickness larger than a remaining portion thereof, said first portion being adjacent to a vertex of the permanent magnet, and said second portion being adjacent to a circular arc of the permanent magnet.

10. A permanent magnet arrangement as claimed in claim 6, wherein a ratio of the radius of said permanent magnet arrangement to a radius of a target provided in the vicinity of said permanent magnet arrangement is more than 1.1.

11. A permanent magnet arrangement for magnetron plasma processing, comprising:

a plurality of permanent magnets each of which has an equilateral triangular cross section parallel to major surfaces thereof, said plurality of permanent magnets being assembled to form said permanent magnet arrangement which has the form of a polygon, each of said plurality of permanent magnets being made of a rare-earth material and magnetized in a direction parallel to a line extending from a line extending from a midpoint of a base of said magnet to a vertex thereof.

12. A permanent magnet arrangement as claimed in claim 11, wherein each of said plurality of permanent magnets has a portion, adjacent to a vertex, which is formed such as to have a thickness larger than a remaining portion thereof.

13. A permanent magnet arrangement as claimed in claim 11, wherein each of said permanent magnets has a portion, adjacent to a base of said permanent magnet, which is formed such as to have a thickness larger than a remaining portion thereof.

14. A permanent magnet arrangement as claimed in claim 11, wherein each of said plurality of permanent magnets has first and second portions each of which is formed such as to have a thickness larger than a remaining portion thereof, said first portion being adjacent to a vertex of the permanent magnet, and said second portion being adjacent to a base of said permanent magnet.

* * * * *